United States Patent
Amo et al.

(10) Patent No.: US 6,690,053 B2
(45) Date of Patent: Feb. 10, 2004

(54) SHARED CONTACT IN A SEMICONDUCTOR DEVICE IN WHICH DRAMS AND SRAMS ARE COMBINED AND METHOD OF MANUFACTURING THE SAME

(75) Inventors: Atsushi Amo, Tokyo (JP); Masatoshi Kimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/162,169

(22) Filed: Jun. 5, 2002

(65) Prior Publication Data

US 2003/0006444 A1 Jan. 9, 2003

(30) Foreign Application Priority Data

Jul. 6, 2001 (JP) ........................ 2001-206786

(51) Int. Cl.[7] .................. H01L 27/108; H01L 29/76; H01L 29/94; H01L 31/94; H01L 31/113; H01L 31/062; H01L 31/119
(52) U.S. Cl. .................. 257/306; 257/393; 257/903
(58) Field of Search .................. 257/306–310, 257/903–904, 393; 438/253–254, 152

(56) References Cited

U.S. PATENT DOCUMENTS

| 6,031,271 A | | 2/2000 | Imai | |
| 6,069,038 A | * | 5/2000 | Hashimoto et al. | 438/241 |
| 6,506,647 B2 | * | 1/2003 | Kuroda et al. | 438/275 |

FOREIGN PATENT DOCUMENTS

JP    B2 3064999    5/2000

* cited by examiner

*Primary Examiner*—Cuong Q. Nguyen
(74) *Attorney, Agent, or Firm*—Burns, Doane, Swecker & Mathis, LLP

(57) ABSTRACT

The semiconductor device according to the present invention comprises side wall 9 formed over the sidewall of gate wiring 6 of a logic SRAM region, doped polysilicon 18 electrically connecting silicide layer 13 formed over the surface of diffused layer 11 and silicide layer 15 of gate wiring 6, W plug 26 electrically connecting doped polysilicon 18 and a first layer aluminum wiring, and W plug 25 electrically connecting the silicide layer over the surface of diffused layer 11 in the logic SRAM region and the first layer aluminum wiring.

7 Claims, 10 Drawing Sheets

DRAM MEMORY CELL REGION      LOGIC SRAM REGION

US 6,690,053 B2

SHARED CONTACT IN A SEMICONDUCTOR DEVICE IN WHICH DRAMS AND SRAMS ARE COMBINED AND METHOD OF MANUFACTURING THE SAME

BACKGROUND OF THE INVENTION

1. Field of the Invention

The present invention relates to a semiconductor device in which DRAMs and SRAMs are combined. It particularly relates to a semiconductor device having a structure in which a shared contact that is effective for reducing a cell area of SRAMs can be easily formed, and to a method of manufacturing the device.

2. Description of the Prior Art

FIG. 9 is a circuit diagram showing the memory cell of a SRAM used in a conventional semiconductor device. Referring to FIG. 9, PMOS load transistors 101 and 102 each serve as a load, NMOS drive transistors 103 and 104 each serve as a charge puller, NMOS access transistors 105 and 106 each serve as an information deriver to a bit line, Vcc is a power supply line, GND is a grand line, and WL is a word line. In addition, NMOS access transistor 105 connects with bit line 'BL', and NMOS access transistor 106 connects with bit bar line '/BL'.

FIG. 10 is a layout diagram showing the memory cell of a SRAM used in a conventional semiconductor device, and it is a layout sample of the circuit diagram shown in FIG. 9. In FIG. 10, because the same or corresponding part is designated by the same numeral as the one in FIG. 9, the explanation is omitted. Gate 111 is the gate of PMOS load transistor 101 and NMOS drive transistor 103, gate 112 is the gate of PMOS load transistor 102 and NMOS drive transistor 104, gate 113 is the gate of NMOS access transistor 105, and gate 114 is the gate of NMOS access transistor 106.

Additionally, in FIG. 10, on-the-active-region contact 115 is the on-the-active-region contact of NMOS drive transistor 103 and NMOS access transistor 105, on-the-gate contact 116 is the on-the-gate contact of PMOS load transistor 102 and NMOS drive transistor 104, on-the-active-region contact 117 is the on-the-active-region contact of PMOS load transistor 101, on-the-active-region contact 118 is the on-the-active-region contact of PMOS load transistor 102, on-the-gate contact 119 is the on-the-gate contact of PMOS load transistor 101 and NMOS drive transistor 103, on-the-active-region contact 120 is the on-the-active-region contact of NMOS drive transistor 104 and NMOS access transistor 106, first layer aluminum wiring 121 connects on-the-active-region contacts 115, 117, and on-the-gate contact 116, first layer aluminum wiring 122 connects on-the-active-region contacts 118,120 and on-the-gate contact 119, first layer aluminum wiring 123 connects with PMOS load transistor 101, on-the-active-region contact 124 is the on-the-active-region contact of PMOS load transistor 102, and first layer aluminum wiring 125 connects with on-the-active-region contact 124.

Additionally, first layer aluminum wiring 121 is the cross coupling part that connects the output of PMOS load transistor 101 and NMOS drive transistor 103 to gate 112 of PMOS load transistor 102 and NMOS drive transistor 104, and first layer aluminum wiring 122 is the cross coupling part that connects the output of PMOS load transistor 102 and NMOS drive transistor 104 to gate 111 of PMOS load transistor 101 and NMOS drive transistor 103. Throughholes and aluminum wirings existing above the first layer aluminum wiring are not shown. In the layout sample shown in FIG. 10, contacts 115–120, and 124 are independently arranged. Herein, contacts 115–120, and 124 independently arranged are occasionally referred to as "usual contact".

FIG. 11 is a layout diagram showing the memory cell of a SRAM used in the conventional semiconductor device, and it is a sample of the reduction of the cell region by use of a shared contact in comparison to the layout diagram shown in FIG. 10. Because in FIG. 11 the same numerals show the same or equivalent parts to the ones in FIG. 10, the explanation is omitted. Shared contact 131 forms on-the-gate contact 116 and on-the-active-region contact 117 by use of one contact, and shared contact 132 forms on-the-gate contact 119 and on-the-active-region contact 118 by use of a simple contact. As shown in FIG. 11, because the cell size in the direction of the gate width is reduced, the cell region of the SRAM can be reduced.

FIG. 12 is a sectional view showing the manufacturing process of a SRAM in the conventional semiconductor device, and it corresponds to the sectional view along the line A–A' shown in FIG. 11. In FIG. 12, well 201 is present within the silicon substrate; isolation oxide film 202 and gate oxide film 203 are formed on well 201; gate electrode 204 is equivalent to gate 112; gate wiring 205 is equivalent to the wiring part of gate 111; side wall 206 is formed over the sidewall of gate electrode 204; side wall 207 is formed over the sidewall of gate electrode 205; diffused layer 208 is the diffused layer of source/drain; silicide layer 209 is a silicide layer over diffused layer 208; silicide layer 210 is a silicide layer over gate electrode 204; silicide layer 211 is a silicide layer over gate wiring 205; and silicon nitride film 212 is formed over isolation oxide film 202.

Moreover, in FIG. 12, contact interlayer film 213 is formed with silicon dioxide film; barrier metals 214 and 215 each are formed over the bottom and the sidewall of the contact; tungsten plugs 216 and 217 (referred to as W plug hereinafter) each are formed within the contact holes; barrier metals 218 and 219 are respectively formed over the bottom of aluminum wirings 220 and 221; and ARC (Anti Reflective Coat) films 222 and 223 are formed as an anti-reflecting film in a photolithography process. Here, on-the-active-region contact 124 corresponds to the area where barrier metal 214 and W plug 216 are formed; shared contact 132 corresponds to the area where barrier metal 215 and W plug 217 are formed; first layer aluminum wiring 122 corresponds to the area where barrier metal 218, aluminum wiring 220, and ARC film 222 are formed; and first layer aluminum wiring 125 corresponds to the area where barrier metal 219, aluminum wiring 221, and A RC film 223 are formed. On-the-active-region contact 124 and shared contact 132 are formed in the same process, and they are not formed in different processes, for instance, a photolithography process and an etching process. Incidentally, although not shown in the sectional view, contacts existing on gates 113 and 114 are also formed in the same process as the process in which on-the-active-region contact 124 and shared contact 132 are formed.

Examples of the patent disclosing the conventional semiconductor device described above include Japanese Patent No. 3,064,999 and U.S. Pat. No. 6,031,271.

The conventional semiconductor device has been constructed as mentioned above. As a result, because in a system LSI in which DRAMs and SRAMs are combined, a contact interlayer film is thicker in order to form the capacitor layer of the DRAM, there exist a drawback that forming a usual or typical contact and a shared contact at the same time is difficult; the failure of junction leakage occurs; and the contact resistance increases.

The drawback of the conventional technology will next be described in detail.

In the process of manufacturing the SRAM of the conventional semiconductor device shown in FIG. 12, since the film thickness of contact interlayer film 213 is 0.5–0.8 μm, on-the-active-region contact 124 and shared contact 132 can be formed at the same time. On the other hand, in the manufacturing process of a system LSI in which DRAMs and SRAMs are combined, because the film thickness of contact interlayer film 213 should be 1.0–3.0 μm in order to form the capacitor layer of the DRAM, the simultaneous formation of on-the-active-region contact 124 and shared contact 132 becomes difficult.

Additionally, in FIG. 12, when on-the-active-region contact 124 and shared contact 132 are formed by etching contact interlayer film 213 formed with silicon dioxide film by use of, for instance, a dry etching method, silicon nitride film 212 has the function of stopping the etching of contact interlayer film 213 by means of a selective etching method in which a difference in etching rate is used. That is, silicon nitride film 212 serves as a stopper layer in the etching process. However, the part of silicon nitride film 212 deposited over side wall 207 has a lower selective ratio to the silicon dioxide film than the part of silicon nitride film 212 deposited over the flat area. Furthermore, because, when the film thickness of contact interlayer film 213 is large, an over-etching time becomes long in the etching process in which shared contact 132 is formed, the part of silicon nitride film 212 deposited over side wall 207 is almost removed. In addition, side wall 207 (formed with silicon nitride film) is almost removed in the etching process of silicon nitride film 212 following the etching process of contact interlayer film 213.

For this reason, W plug 217 and barrier metal 215 of shared contact 132 will electrically connect with side wall 207 between silicide layer 209 and gate wiring 205. Because the diffused layer in this area has a low dopant concentration due to the LDD structure, and therefore has hardly undergone a silicide formation reaction, there is a drawback that these affairs cause a failure of junction leakage. Moreover, in an etching process in which on-the-active-region contact 124 and shared contact 132 are formed within contact interlayer film 213, when the etching is done in the etching condition where the selective ratio to silicon nitride film 212 is increased, on-the-active-region contact 124 and shared contact 132 have a taper angle lower than 90°, and form an extreme gentle-slope taper. Therefore, since the diameters at the bottoms of contacts 124 and 132 is smaller when the film thickness of contact interlayer film 213 is larger, there has been a drawback that the contact resistance increases; furthermore there occurs a failure that on-the-active-region contact 124 and shared contact 132 have no opening.

SUMMARY OF THE INVENTION

The present invention has been accomplished to solve the above-mentioned problem. An object of the present invention is to provide a semiconductor device where, in a system LSI in which DRAMs and SRAMs are combined, a usual contact and a shared contact can be formed at the same time, and the occurrence of the junction leakage failure and the increase in the contact resistance can be suppressed even when the film thickness of a contact interlayer film becomes large so as to form the capacitor layer of the DRAM, and to provide the manufacturing method thereof.

According to a first aspect of the present invention, there is provided a semiconductor device in which DRAMs and SRAMs are combined, the device comprising in the SRAM region: a first silicide layer formed on the surface of a diffused layer adjacent to a gate electrode; a second silicide layer on the surface of the gate electrode; an insulating side wall formed over the sidewall of the gate electrode; a first contact hole opened in a first interlayer dielectric formed on top, and exposing the side wall and the first and second silicide layers in the hole; a first contact which constitutes a shared contact between the first and second silicide layers through a first plug within the first contact hole; a second contact hole opened in a second interlayer dielectric formed on top; a first wiring layer formed on this second interlayer dielectric; a second contact for connecting electrically the first contact to the first wiring layer through a second plug within the second contact hole; a third contact hole opened in the first and second interlayer dielectrics, and exposing the first silicide layer on the surface of the diffused layer in the hole; and a third contact for connecting electrically the first silicide layer to the first wiring layer through the second plug within the third contact hole.

Here, the third contact formed in the third contact hole may have the first plug between the second plug and the first silicide on the surface of the diffused layer.

The semiconductor device further comprises in the DRAM region: an insulating side wall over the sidewall of a gate electrode; a lower contact formed through the first plug within the first contact hole which is opened in the first interlayer dielectric formed on top, adjacent to the gate electrode, and exposes the surface of the diffused layer; and an upper contact formed through the second plug within the second contact hole opened in the second interlayer dielectric formed on top, and connecting electrically the lower contact to the first wiring layer.

The first contact may be formed in the same process as the lower contact of the DRAM.

The second and third contacts may be formed in the same process as the upper contact of the DRAM.

At least one of the first and second plugs may be made of a metal containing tungsten.

The second interlayer dielectric may be constituted by stacking a second dielectric on a first dielectric, and the second contact hole may be opened by selective etching between the first and second dielectrics.

The first and second dielectrics may be respectively constituted by silicon nitride and silicon oxide.

According to a second aspect of the present invention, there is a method of manufacturing a semiconductor device in which DRAMs and SRAMs are combined, comprising the steps of: forming a insulating side wall over the sidewall of a gate electrode; converting the surface of a diffused layer and the surface of the gate electrode into silicide; forming a first interlayer dielectric; forming the opening of a lower contact of the DRAM and the opening of a first contact of the SRAM in the first interlayer dielectric; forming first plugs within the opening of the lower contact of the DRAM and the opening of the first contact of the SRAM; forming a dielectric for selective-etching over the DRAM; forming a capacitor layer over the DRAM while forming a second interlayer dielectric over the SRAM; forming the opening of an upper contact of the DRAM, the opening of a second contact of the SRAM, and the opening of a third contact of the SRAM; and forming second plugs within the opening of the upper contact of the DRAM, the opening of the second contact of the SRAM, and the opening of the third contact of the SRAM.

Here, the first plug may be formed in the opening of the lower contact of the DRAM, and in a region which constitutes a shared contact among the openings of the first contact of the SRAM.

DETAILED DESCRIPTION OF THE PREFERRED EMBODIMENTS

An embodiment of the present invention will be described below.

Embodiment 1

Figure 1:
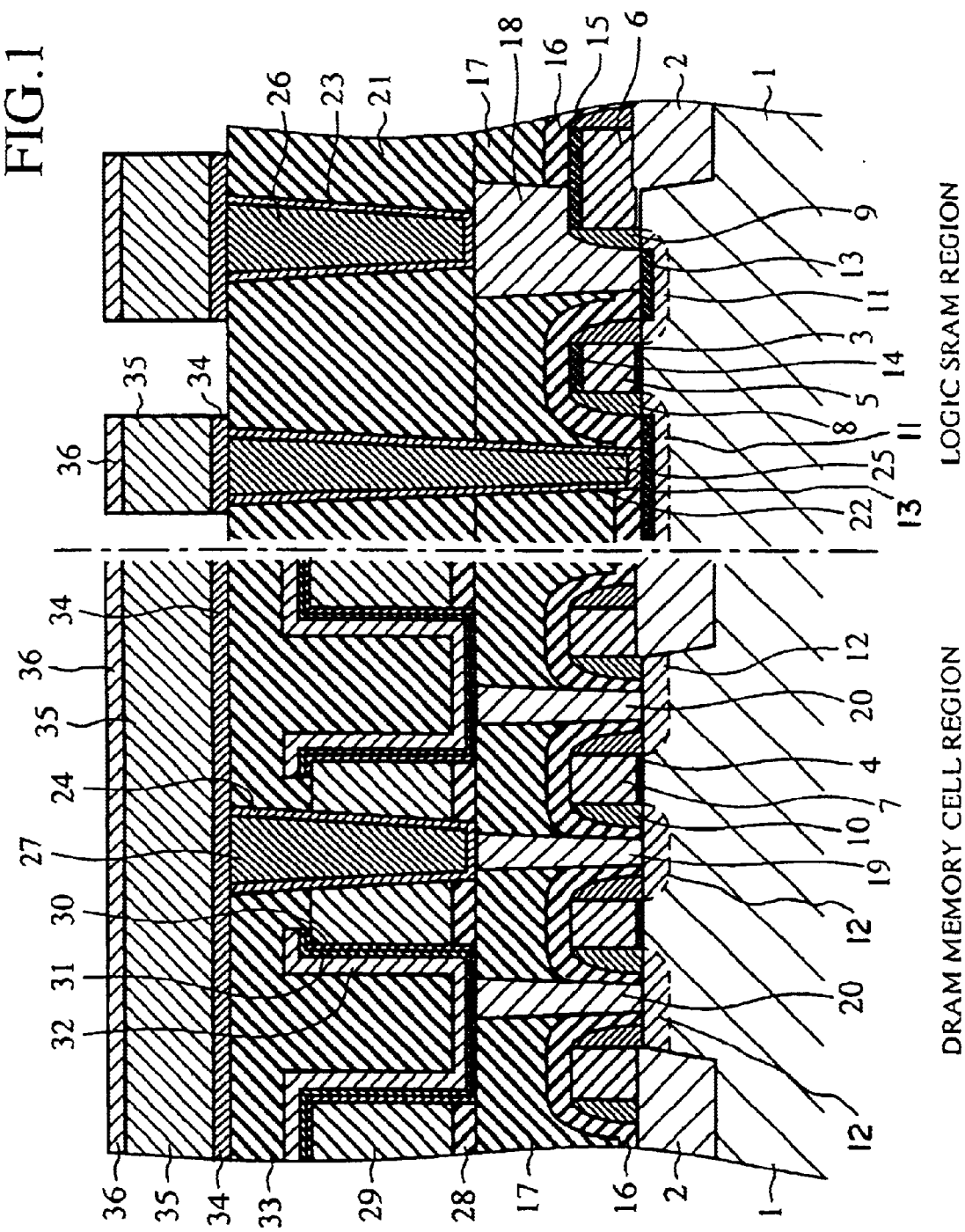
FIG. 1 is a sectional view showing the semiconductor device manufacturing process according to Embodiment 1 of the present invention.

FIG. 1 is a sectional view showing the semiconductor device manufacturing process according to Embodiment 1 of the present invention, and a sectional view showing the manufacturing process of a DRAM memory cell region (DRAM) and a logic SRAM region (SRAM). Note that the DRAM memory cell region and the logic SRAM region are combined on a single chip, and they constitute a system LST. In FIG. 1, well 1 is present within the silicon substrate, and isolation oxide film 2, gate oxide film 3 of the logic SRAM region, and gate oxide film 4 of the DRAM memory cell region are formed on well 1. Incidentally, in the method of manufacturing the system LSI in which DRAMs and SRAMs are combined or hybridized, in order to be compatible with both the performances of the DRAM memory cell region and the logic SRAM region, gate oxide films 3 and 4 are occasionally formed by use of a manufacturing method in which gate oxide film 3 of the logic SRAM region having the film thickness that is smaller than the film thickness of gate oxide film 4 of the DRAM memory cell region is produced, so-called a dual oxide process.

Moreover, in FIG. 1, gate electrode 5 of the logic SRAM region and gate wiring (gate electrode) 6 of the logic SRAM region, and gate electrode 7 of the DRAM memory dell region are formed on well 1; insulating side wall 8 is formed over the sidewall of gate electrode 5 of the logic SRAM region; insulating side wall 9 is formed over the sidewall of gate electrode 6 of the logic SRAM region; insulating side wall 10 is formed over the sidewall of gate electrode 7 of the DRAM memory cell region; diffused layer 11 of the source drain of the logic SRAM region; and diffused layer 12 of the source drain of the DRAM memory cell region are formed on well 1.

In addition, in FIG. 1, a silicide formation technology is used for the logic SRAM region; silicide layer (first silicide layer) 13 is formed on diffused layer 11 of the source drain of the logic SRAM region; silicide layer 14 is formed over gate electrode 5 of the logic SRAM region; and silicide layer (second silicide layer) 15 is formed over gate wiring 6 of the logic SRAM region. Incidentally, a cobalt silicide layer, for instance, is used for these silicide layers.

Additionally, in FIG. 1, silicon nitride film 16 is formed as a dielectric or insulation film and also a stopper layer in the etching process; contact interlayer film (first interlayer dielectric) 17 is formed by use of a silicon dioxide film; doped polysilicon (first plug) 18 is buried in the lower contact (first contact, a contact hole) so as to create a shared contact which connects electrically the silicide layer on the upper surface of the gate wiring 6 to the silicide layer on the diffused layer 11, within a contact hole (opening) opened in the contact interlayer film 17 in the logic SRAM region; doped polysilicon (first plug) 19 is buried in the lower contact of a bit line direct contact consisting of two contacts, upper and lower contacts in the DRAM memory cell region; doped polysilicon (first plug) 20 is buried in a storage node direct contact (lower contact); contact interlayer film (second contact interlayer film) 21 is formed by use of a silicon dioxide film in the logic SRAM region; barrier metal 22 is formed over the sidewall of the contact (third contact) directly connecting the silicide layer (first silicide layer) formed over the active region in the logic SRAM region to the first layer aluminum wiring (first wiring layer); barrier metal 23 is formed over the sidewall of the upper contact (second contact) of the shared contact consisting of two contacts, upper and lower contacts in the logic SRAM region; barrier metal 24 is formed over the sidewall of the upper contact (the upper contact) of the bit line direct contact consisting of two contacts, upper and lower contacts in the DRAM memory cell region; W plug (a second plug) 25 is buried in the contact directly connecting the active region in the logic SRAM region and the first layer aluminum wiring; W plug (a second plug) 26 is buried in the upper contact (a second contact) of the shared contact consisting of two contacts, upper and lower contacts in the logic SRAM region, and connected with the first layer aluminum wiring (a first wiring layer); W plug (a second plug) 27 is buried in the upper contact of the bit line direct contact consisting of two contacts, upper and lower contacts in the DRAM memory cell region.

In addition, in FIG. 1, silicon nitride film (dielectric) 28 is formed only in the DRAM memory cell region; storage node interlayer film 29 is formed by use of a silicon dioxide film; storage node electrode 30 is formed by use of, for instance, a doped polysilicon; capacitor dielectric film 31 is formed by use of, for instance, a tantalum oxide film; cell plate electrode 32 is formed by use of, for instance, a titanium nitride (TiN) film; and contact interlayer film 33 is formed over cell plate electrode 32 by use of a silicon dioxide film. Moreover, herein, storage node interlayer film 29, storage node electrode 30, capacitor dielectric film 31, cell plate electrode 32, and contact interlayer film 33 are generically referred to as a "capacitor layer".

In addition, in FIG. 1, barrier metal 34, aluminum wiring 35, and ARC film 36 serving as an anti-reflecting film in the photolithography process are formed. The first layer aluminum wiring corresponds to the area where barrier metal 34, aluminum wiring 35, and ARC film 36 are formed. Here, because the layers existing above the first layer aluminum wiring are not directly connected with the nature of the present invention, the explanation and illustration are omitted.

The manufacturing method will next be described.

Figure 2:
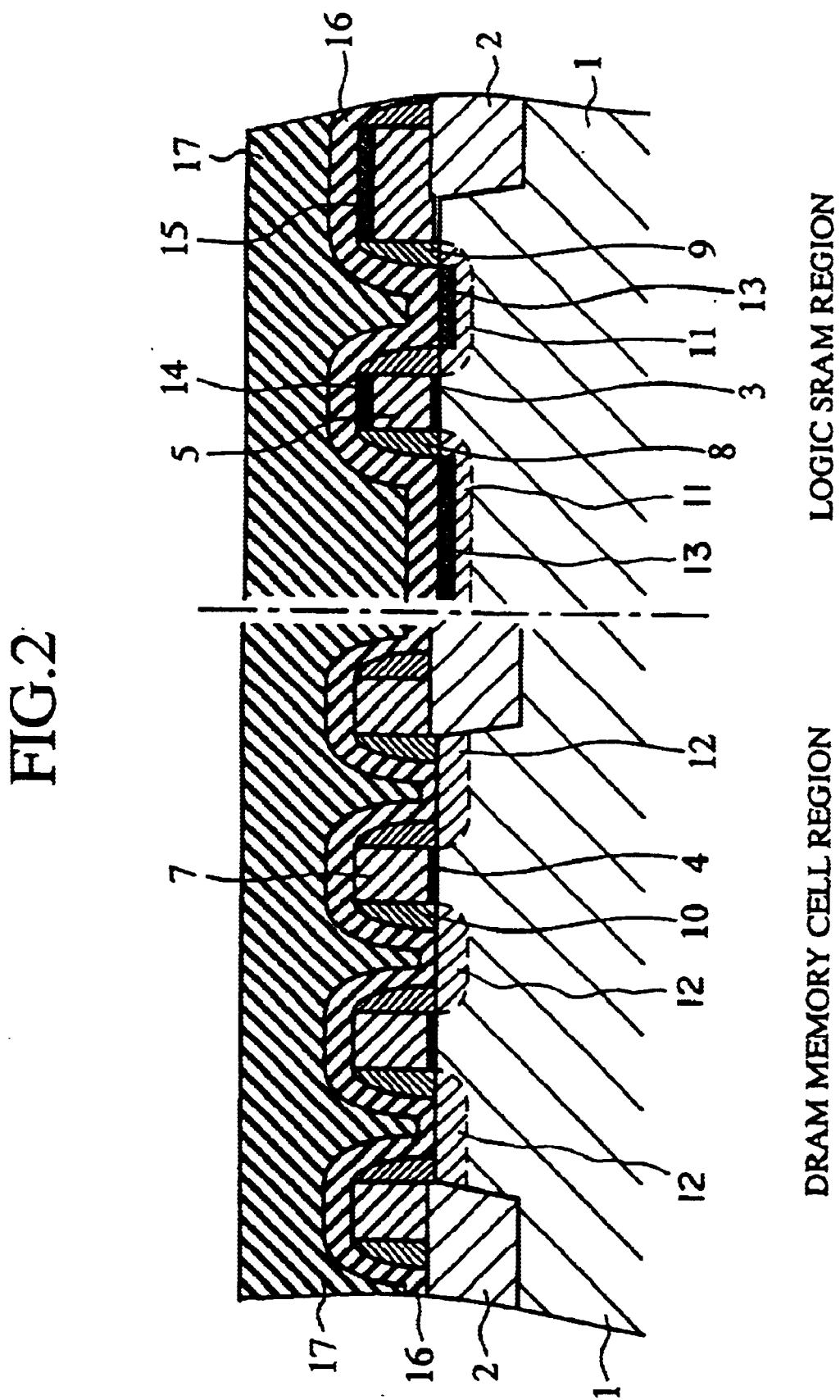
FIG. 2 is a sectional view showing the manufacturing process for explaining the semiconductor device manufacturing method according to Embodiment 1 of the present invention.

FIGS. 2–5 are sectional views showing the manufacturing process for explaining the semiconductor device manufacturing method according to Embodiment 1 of the present invention. First of all, well 1 within the silicon substrate is formed by means of ion implantation, for instance, and then isolation oxide film 2 is selectively formed by means of a LOCOS method or a ST construction method, for instance. Subsequently, gate oxide films 3 and 4 are formed by means of a dual oxide process, for instance, and gate electrodes 5 and 7, and gate wiring 6 are formed. A silicon nitride film is deposited and etched, to thereby form side walls 8, 9, and 10. Then, cobalt (Co) is deposited by sputtering, followed by heat-treating it, and the part thereof not undergoing the reaction between cobalt and silicon is removed, to thereby form a cobalt silicide layer as silicide layers 13, 14, and 15. Silicon nitride film 16 is deposited by means of LP-CVD (Low-Pressure-Chemical-Vapor Deposition), for instance, and contact interlayer film 17 is deposited by means of CVD, for instance. Then, contact interlayer film 17 is planarized by means of reflow or CMP. FIG. 2 is the sectional view showing the work processed in the manufacturing steps described up to this time. Because in FIG. 2 the same or equivalent parts are designated by similar numerals to the ones in FIG. 1, the explanation is omitted.

Figure 3:
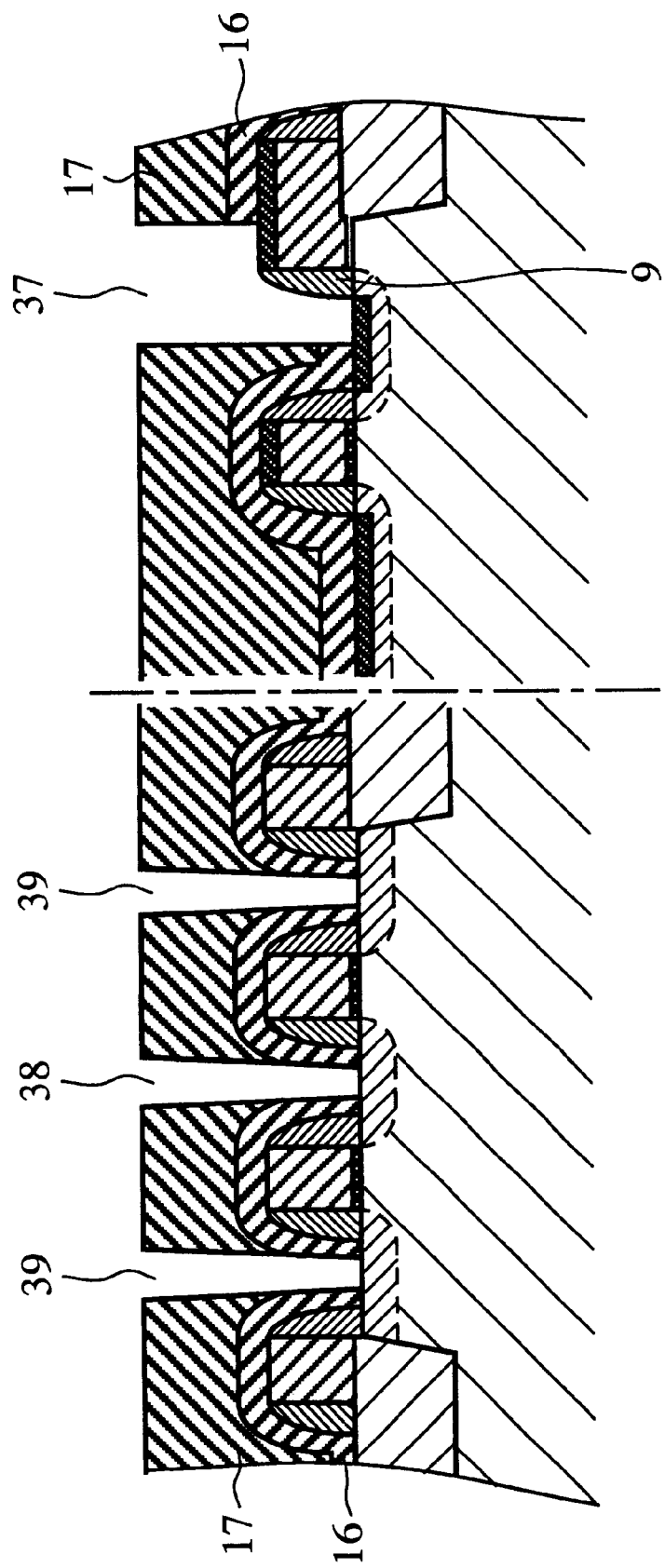
FIG. 3 is a sectional view showing the manufacturing process for explaining the semiconductor device manufacturing method according to Embodiment 1 of the present invention.

After that, in the photolithography process, a photoresist coated over contact interlayer films 17 is processed to have a predetermined pattern, and then contact interlayer film 17 is etched by use of a RIE apparatus, for instance. This etching process is a process where the silicon dioxide film and the silicon nitride film are selectively etched, and additionally, contact interlayer film 17 formed by use of silicon dioxide film has a film thickness of 0.5–0.8 $\mu$m. Accordingly, when contact interlayer film 17 is etched, the part of silicon nitride film 16 deposited over side wall 9 is not removed by over-etching. Then, silicon nitride film 16 is etched by use of a RIE apparatus, for instance. FIG. 3 is the sectional view showing the work processed is the manufacturing steps described up to now. Because in FIG. 3 the same or equivalent parts are designated by similar numerals to the ones in FIG. 1, the explanation is omitted opening (contact hole) 37 is the opening of the lower contact of the shared contact consisting of two contacts, upper and lower contacts in the logic SRAM region; opening 38 is the opening of the lower contact of the bit line direct contact consisting of two contacts, upper and lower contacts in the DRAM memory cell region; and opening 39 is the opening of the contact in the storage node contact. Incidentally, a contact existing on the gate of a NMOS access transistor (not shown) is formed in the same process.

Figure 4:
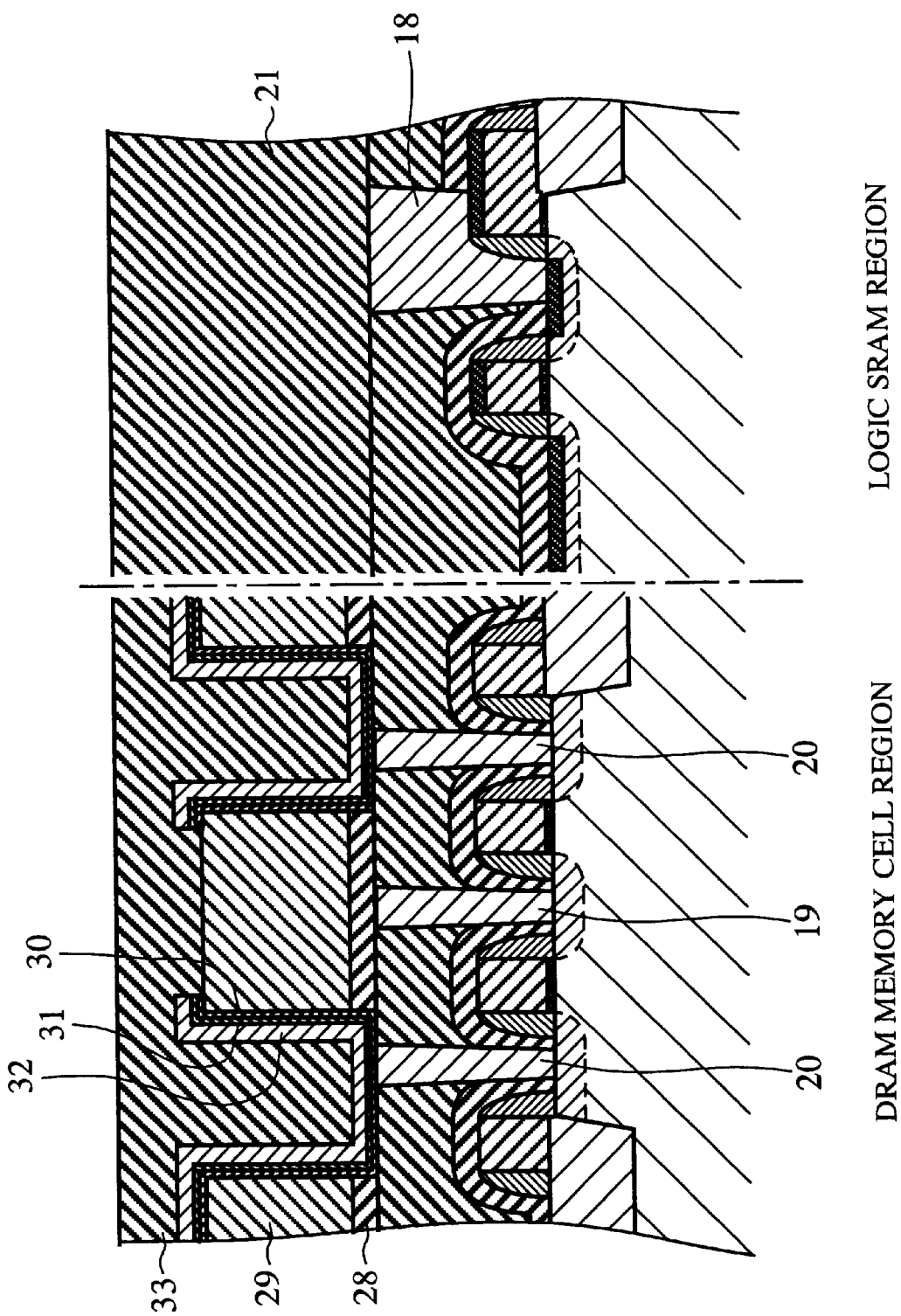
FIG. 4 is a sectional view showing the manufacturing process for explaining the semiconductor device manufacturing method according to Embodiment 1 of the present invention.

Subsequently, doped polysilicons 18–20 are buried in openings 37–39 of each contact by depositing doped polysilicon by LP-CVD, for instance, and planarizing the polysilicon. Here, since the bonding of silicide layer 13 and doped polysilicon 18 is a metal-silicon bonding, this establishes an ohmic bonding, to thereby produce resistance that does not interfere with the SRAM operation. After that, silicon nitride film 28 is deposited by LP-CVD, for instance, and silicon nitride film 28 in the logic SRAM region is removed in the photolithography process and the etching process. Next, storage node interlayer film 29 is formed by depositing a silicon dioxide film and processing the film in a predetermined way. A capacitor is formed by stacking storage node electrode 30, capacitor dielectric film 31, and cell plate electrode 32 in succession and processing them. Then, contact interlayer film 33 is deposited over cell plate electrode 32, and planarized. By the way, contact interlayer film 21 in the logic SRAM region consists of storage node interlayer film 29 and contact interlayer film 33. FIG. 4 is the sectional view showing the work processed in the manufacturing steps described up to this time. Because in FIG. 4 the same or equivalent parts are designated by similar numerals to the ones in FIG. 1, the explanation is omitted.

Figure 5:
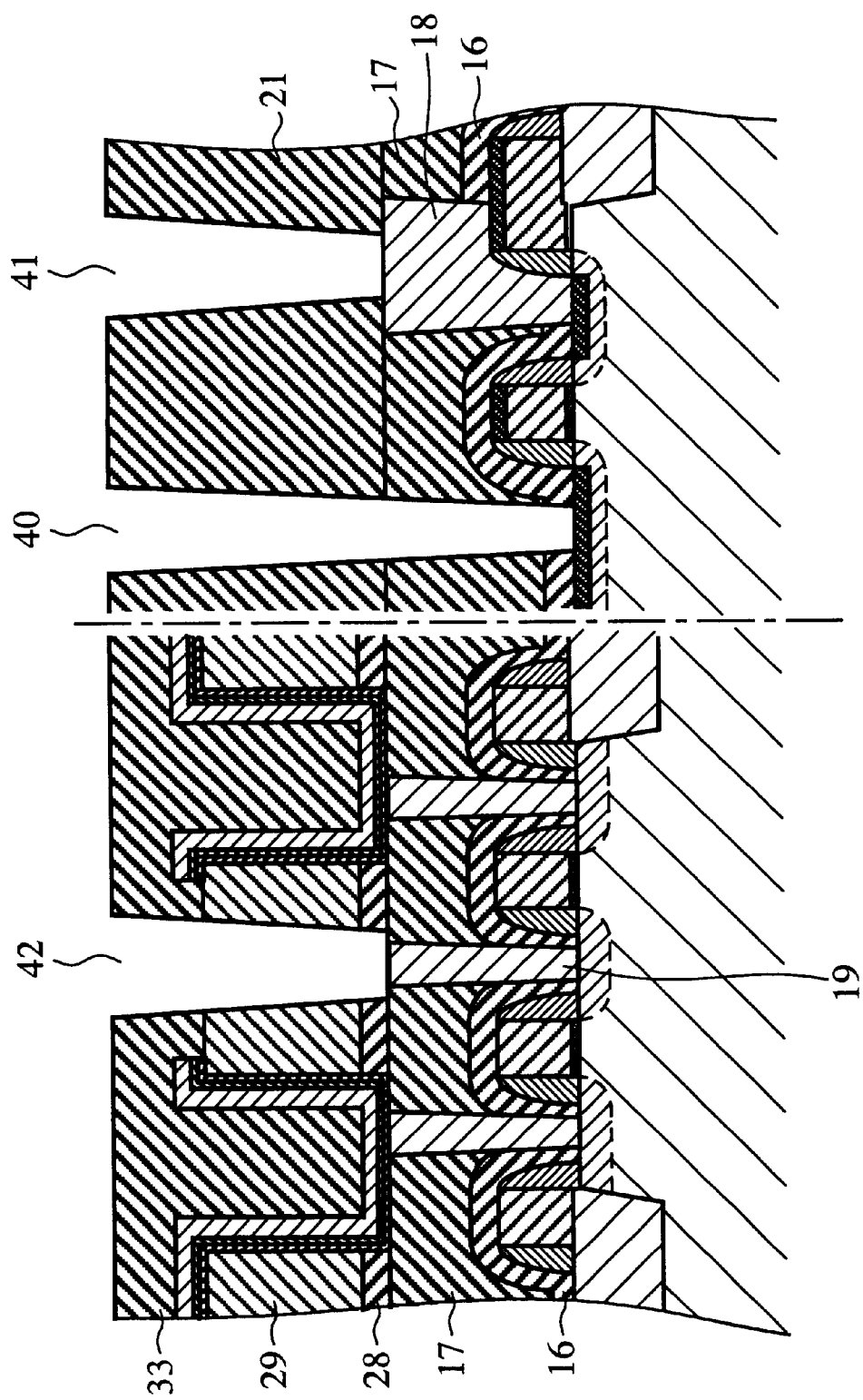
FIG. 5 is a sectional view showing the manufacturing process for explaining the semiconductor device manufacturing method according to Embodiment 1 of the present invention.

After that, in the photolithography process, a photoresist coated over contact interlayer films 21 and 33 is processed to have a predetermined pattern, and then the silicon dioxide film is etched through RIE apparatus, for instance. This etching process is done in two steps. First of all, in the first step, the silicon dioxide film is processed in the etching condition in which a silicon dioxide film can be selectively etched from a doped polysilicon and a silicon nitride film. That is, contact interlayer film 33 and storage node interlayer film 29 are etched sequentially so that the etching may stop in silicon nitride film 28 in the DRAM memory cell region. Moreover, in the logic SRAM region, contact interlayer film 21 is etched so that the etching may stop at doped polysilicon 18, and contact interlayer film 21 and contact interlayer film 17 are etched sequentially so that the etching may stop in silicon nitride film 16. Next, in the second step, the silicon nitride film is processed in the etching condition in which the nitride film can be etched from a doped polysilicon. That is, silicon nitride film 28 in the DRAM memory cell region and silicon nitride film 16 in logic SRAM region are etched so that doped polysilicon 18 is not etched. FIG. 5 is the sectional view showing the work processed in the manufacturing steps described up to this time. Because in FIG. 5 the same or equivalent parts are designated by similar numerals to the ones in FIG. 1, the explanation is omitted. Opening 40 is the opening of the contact in the on-the-active-region contact of the logic SRAM region; opening 41 is the opening of the upper contact of the shared contact consisting of two contacts, upper and lower contacts in the logic SRAM region; and opening 42 is the opening of the upper contact of the bit line direct contact consisting of two contacts, upper and lower contacts in the DRAM memory cell. Additionally, when, in opening 41 of the contact, opening 37 of the lower contact of the shared contact is previously contrived to have a large size in consideration of the alignment errors and the dimensional variations, an increase in the contact resistance can be prevented before it happens.

Subsequently, a barrier metal is deposited over the bottoms and the sidewalls of contacts 40–42 by means of sputtering or CVD, for instance, and processed. Then, W plugs 25–27 are buried by depositing tungsten by means of CVD for instance and planarized it, and then barrier metal 34, aluminum wiring 35, and ARC film 36 of the first layer aluminum wiring are stacked in order and formed. The sectional view showing the work processed in the manufacturing steps described up to this time corresponds to FIG. 1. Here, because the layers existing above the first layer aluminum wiring are not directly connected with the nature of the present invention, the explanation and illustration are omitted. An example in which a contact consists of the opening of a contact and a plug, and the plug consists of a doped polysilicon, or a W plug and a barrier metal, is shown herein.

As mentioned above, according to Embodiment 1, since first of all, the lower contact of the shared contact in the logic SRAM region is formed at the same time in the process of forming the lower contact and the storage node direct contact of the bit line direct contact in the DRAM memory cell region, and furthermore the upper contact of the shared contact and the on-the-active-region contact in the logic SRAM region are formed at the same time in the process of forming-the upper contact of the bit line direct contact in the DRAM memory cell region. Therefore, in a system LSI in which DRAMs and SRAMs are combined, an on-the-active-region contact and a shared contact can be formed at the same time and the occurrence of junction leakage failure and the increase of the contact resistance can be suppressed.

Moreover, according to this Embodiment 1, since, in the system LSI in which a DRAM and a SRAM are combined, the on-the-active-region contact and the shared contact can be formed at the same time, the cell area in the logic SRAM region can be easily reduced.

In addition, according to Embodiment 1, because, in the system LSI in which DRAMs and SRAMs are combined, the shared contact and the on-the-active-region contact in the logic SRAM region are formed concurrently with the process where the contact of the DRAM memory cell region is formed, the number of masks used in the photolithography process does not increase. As a result, an increase in the manufacturing cost and the manufacturing process can be suppressed.

Embodiment 2

Figure 6:
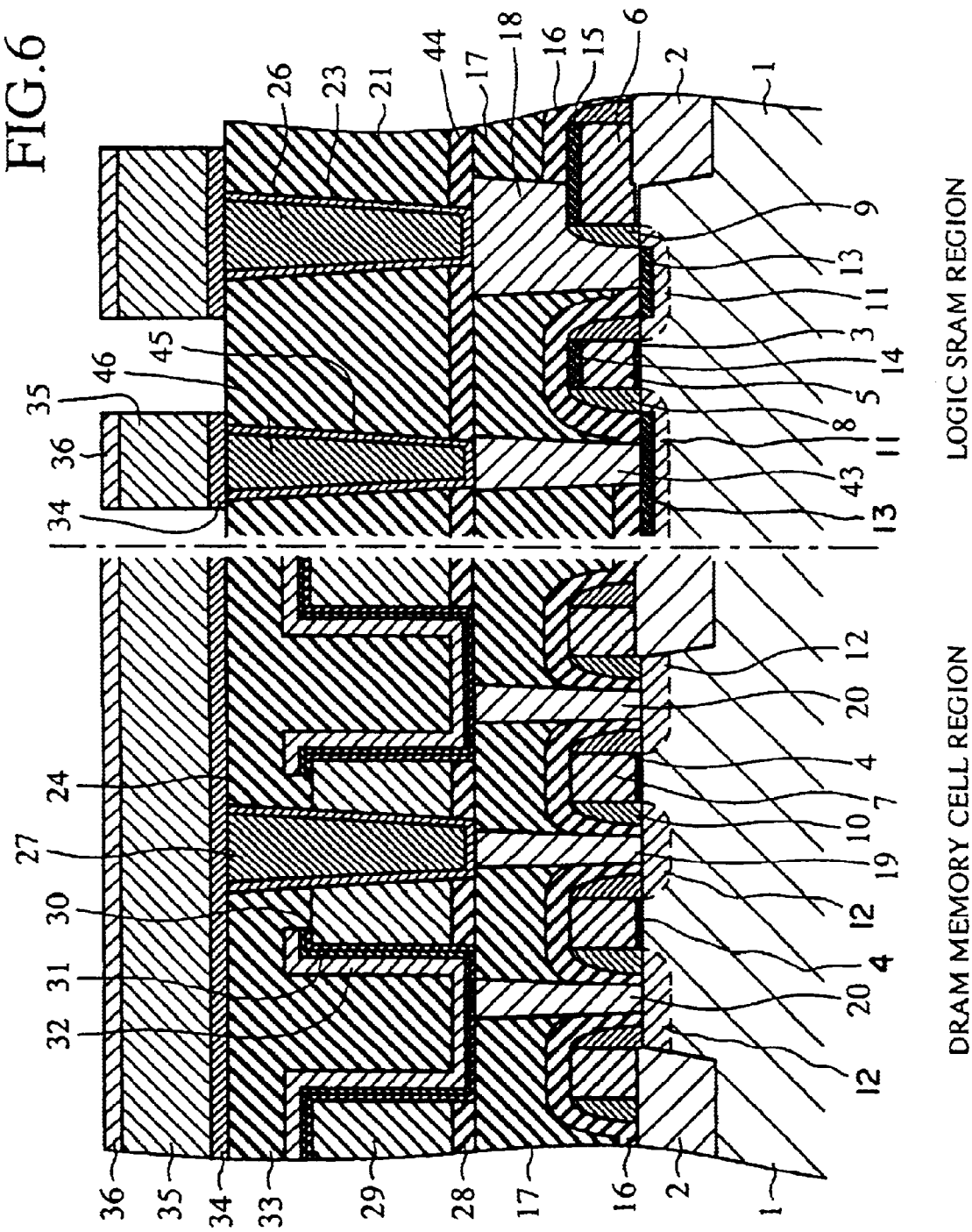
FIG. 6 is a sectional view showing the semiconductor device manufacturing process according to Embodiment 2 of the present invention.

FIG. 6 is a sectional view showing the semiconductor device manufacturing process according to Embodiment 2 of the present invention, and a sectional view showing the manufacturing process of a DRAM memory cell region and a logic SRAM region. Since in FIG. 6 the same or equivalent parts are designated by similar numerals to the ones in FIG. 1, the explanation is omitted. Doped polysilicon (first plug) 43 is buried in the lower contact of the on-the-active-region contact consisting of two contacts, upper and lower contacts in the logic SRAM region; silicon nitride film (first dielectric, dielectric) 44 is formed in the logic SRAM region; barrier metal 45 is formed over the sidewall of the upper contact of the on-the-active-region contact consisting of two contacts, upper and lower contacts in the logic SRAM region; and W plug (second plug) 46 is buried in the upper contact of the on-the-active-region contact. Here, silicon nitride film 44 and silicon nitride film 28 are films deposited in the same process. In Embodiment 2, the process where silicon nitride film 28 of the logic SRAM region is removed is omitted.

The manufacturing method will next be described.

Because the method of manufacturing the DRAM memory cell region in Embodiment 2 is the same as the one in Embodiment 1, the explanation is omitted. Only the part of the method of manufacturing the logic SRAM region that is different from the one in Embodiment 1 will be described. In the process where contact interlayer film 17 shown in FIG. 3 is processed by means if of etching, opening 37 of the lower contact of the shared contact is formed, and at the same time the on-the-active-region contact in which doped polysilicon 43 is buried is formed. Then, a doped polysilicon is deposited by means of LP-CVD for instance and planarized, to thereby bury doped polysilicons 18–20 and 43 in the openings of each contact. After that, silicon nitride films 28 and 44 are deposited by means of LP-CVD for instance. Subsequently, the process where the capacitor layer in the DRAM memory cell region is formed, and the process where contact interlayer film (second dielectric) 21 in the logic SRAM region is formed are performed.

Then, in the photolithography process, a photoresist coated over contact interlayer films 21 and 33 is patterned with a predetermined pattern. Then, the silicon dioxide film is processed by means of etching by use of RIE apparatus for instance. This etching process is performed in two steps. First of all, in the first step, the silicon dioxide film is processed in the etching condition in which a silicon dioxide film can be selectively etched from a silicon nitride film. That is, contact interlayer film 21 is etched such that the etching stops in silicon nitride film 44 in the logic SRAM region. Then, in the second step, the silicon nitride film is processed in the etching condition in which a silicon nitride film can be selectively etched from a doped polysilicon. That is, silicon nitride film 44 in the logic SRAM region is etched such that doped polysilicons 18 and 43 are not etched. It is difficult to form the opening of the contact in the on-the-active-region contact where doped polysilicon 43 was buried having a large opening in consideration of the alignment errors and the dimensional variations. However, because in the first step of the etching process, contact interlayer film 21 is etched such that the etching stops in silicon nitride film 44, the opening of the contact does not require having been formed such that the opening has a large opening. It thereby becomes possible to form the structure of a borderless stacked contact. By the way, the structure of the borderless stacked contact is formed in the on-the-gate contact as well as in the on-the-active-region contact.

As mentioned above, according to Embodiment 2, the same effect as the one in Embodiment 1 is obtained, and simultaneously the following effect is obtained. That is, because first of all, in the process of forming the lower contact of the bit line direct contact in the DRAM memory cell region and the storage node direct contact, the lower contact of the shared contact in the logic SRAM region and the lower contact of the on-the-active-region contact are formed at the same time, and furthermore, in the process of forming the upper contact of the bit line direct contact in the DRAM memory cell region, the upper contact of the shared contact in the logic SRAM region and the upper contact of the on-the-active-region contact are formed at the same time, the aspect ratio of the on-the-active-region contact becomes small in the etching process of forming the on-the-active-region contact. As a result, the on-the-active-region contact can be easily formed.

Moreover, according to this Embodiment 2, because the process where silicon nitride film 28 of the logic SRAM region is removed is omitted, the manufacturing processes decrease compared with the ones in Embodiment 1. As a result, the effect that the manufacturing cost can be reduced and the manufacturing time can be shortened is obtained.

Embodiment 3

Figure 7:
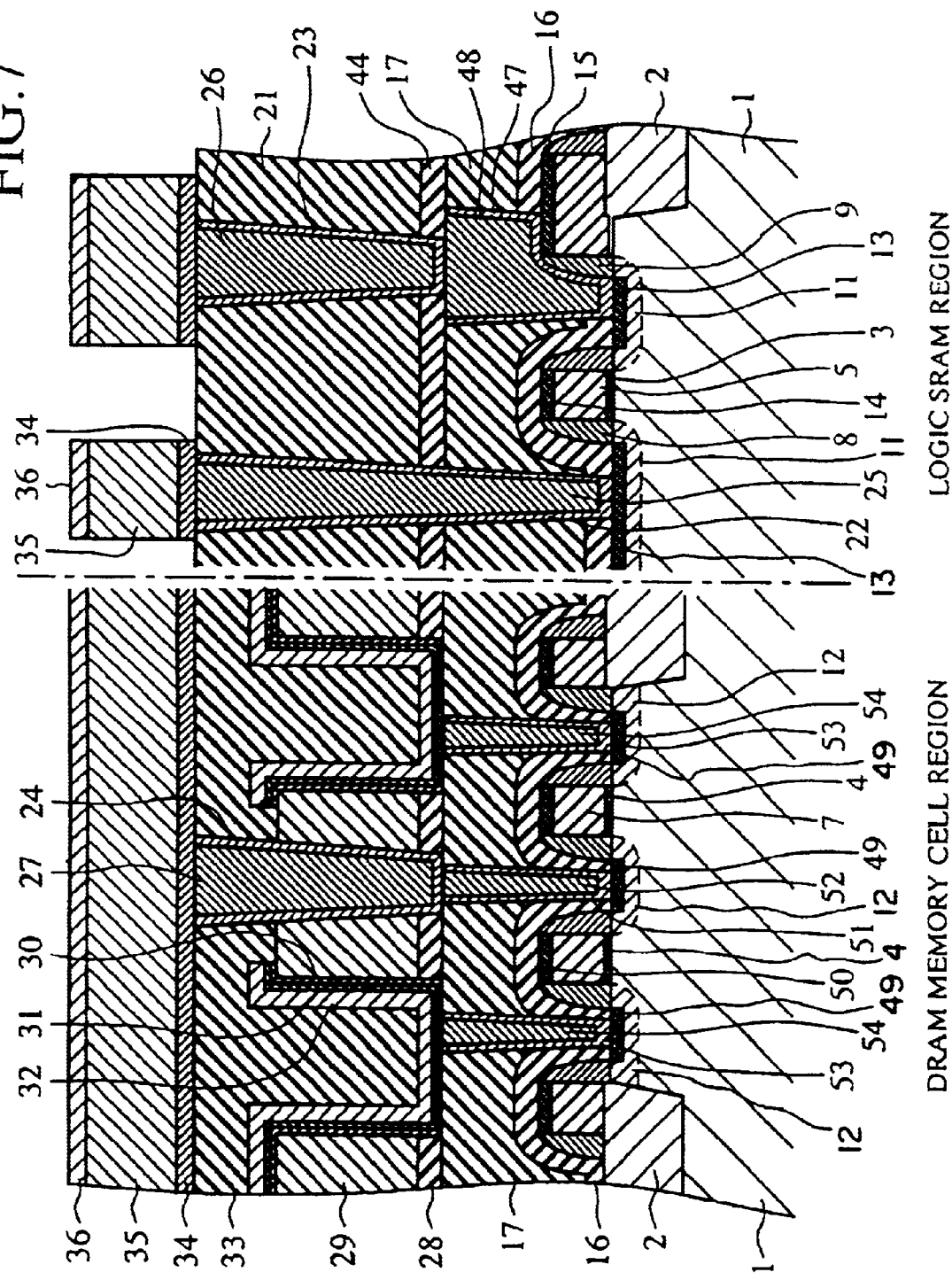
FIG. 7 is a sectional view showing the semiconductor device manufacturing process according to Embodiment 3 of the present invention.

FIG. 7 is a sectional view showing the semiconductor device manufacturing process according to Embodiment 3 of the present invention, and a sectional view showing the manufacturing process of a DRAM memory cell region and a logic SRAM region. Because in FIG. 7 the same or equivalent parts are designated by similar numerals to the ones in FIG. 1, the explanation is omitted. Barrier metal 47 is formed over the sidewall of the lower contact of the shared contact consisting of two contacts, upper and lower contacts in the logic SRAM region; W plug (a first plug) 48 is buried in the lower contact of the shared contact; silicide layer 49 is formed over diffused layer 12 of the source drain of the DRAM memory cell region; silicide layer 50 is formed over gate electrode 7 of the DRAM memory cell region; barrier metal 51 is formed over the sidewall of the lower contact in the bit line direct contact consisting of two contacts, upper and lower contacts in the DRAM memory cell region; W plug (a first plug) 52 is buried in the lower contact in the bit line direct contact; barrier metal 53 is formed over the sidewall of the storage node direct contact; and W plug (a first plug) 54 is buried in the storage node direct contact. It should be noted that because, in contrast to Embodiment 1, the storage node direct contact is a metal, storage node electrode 30 is not formed with doped polysilicon, but with titanium nitride (TiN) film or ruthenium (Ru) film, for instance. Therefore, the capacitor of the DRAM memory cell region has a MIM structure.

The manufacturing method will next be described.

Only the part of the manufacturing method of the semiconductor device in Embodiment 3 that is different from the one in Embodiment 1 will be described. In the process where the silicide layer is formed, the silicide layer was formed only in the logic SRAM region in Embodiment 1. However, in Embodiment 3, the silicide layer is formed in the logic SRAM region and the DRAM memory cell region.

After the manufacturing process shown in FIG. 3 was performed, barrier metals 47, 51, and 53 are deposited over the sidewall of contacts 37–39 by means of, for instance, sputtering or CVD, and then processed. After that, W plugs 48, 52, and 54 are buried by depositing tungsten by means of CVD, for instance, and planarizing it. Subsequently, silicon nitride film 28 is formed in the DRAM memory cell region, and then the process of forming the capacitor layer of the DRAM memory cell region and the process of forming contact interlayer film 21 of the logic SRAM region are performed.

Then, in the etching process in which openings 40–42 of contacts shown in FIG. 5 are formed, in the second step the silicon nitride film is processed in the etching condition where the nitride film can be selectively etched from tungsten. That is, silicon nitride film 28 of the DRAM memory cell region and silicon nitride film 16 of the logic SRAM region are etched such that W plug 48 is not etched. The following manufacturing processes are similar to the ones of Embodiment 1.

As mentioned above, according to Embodiment 3, the same effect as the one in Embodiment 1 is obtained and simultaneously the following effect is obtained. Because W plugs 52 and 54 are formed in the lower contact of the bit line direct contact and the storage node direct contact in the DRAM memory cell region, W plug 48 can be formed in the lower contact of the shared contact in the logic SRAM region. As a result, the contact resistance can be reduced.

Embodiment 4

Figure 8:
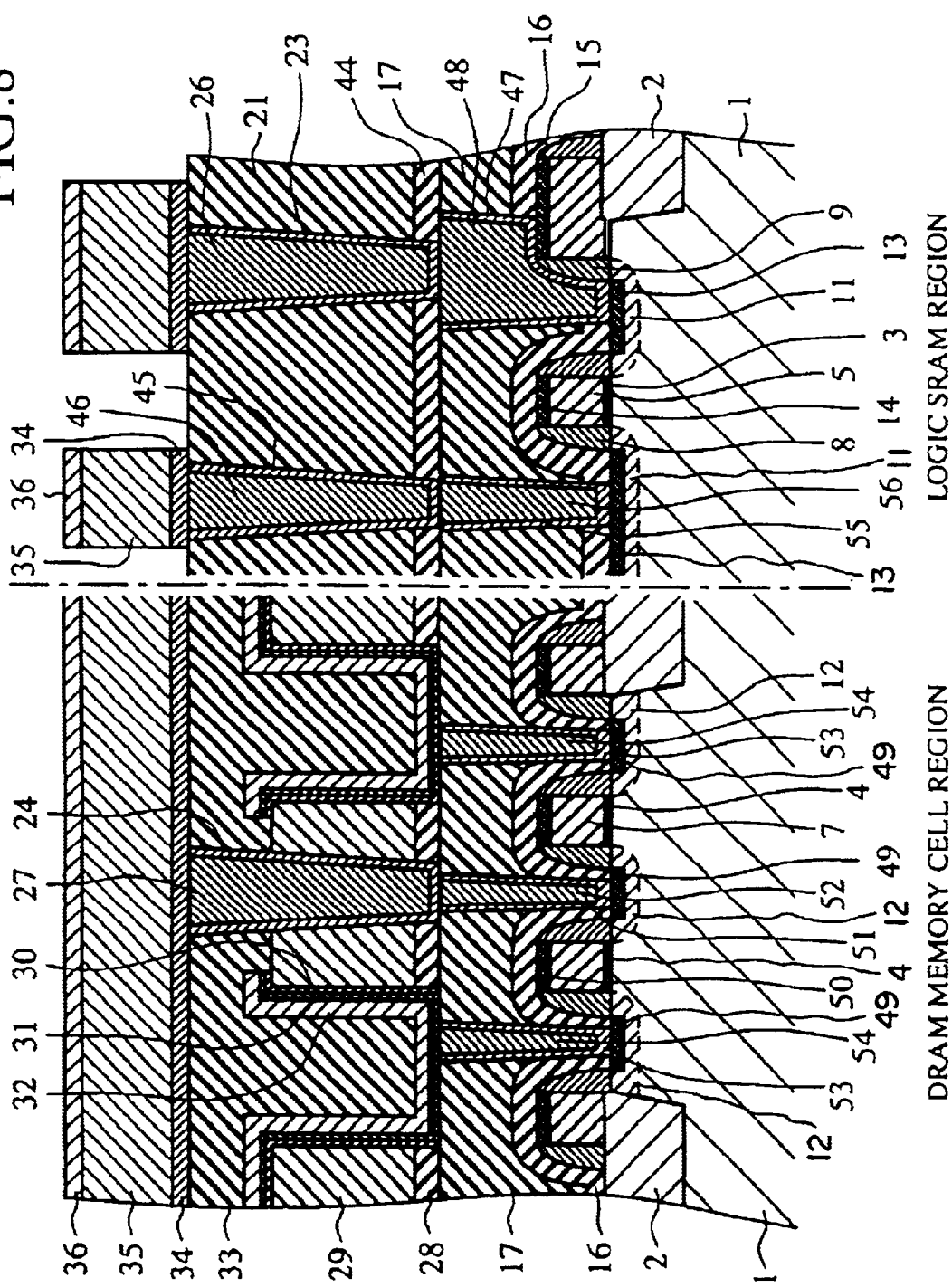
FIG. 8 is a sectional view showing the semiconductor device manufacturing process according to Embodiment 4 of the present invention.
Figure 9:
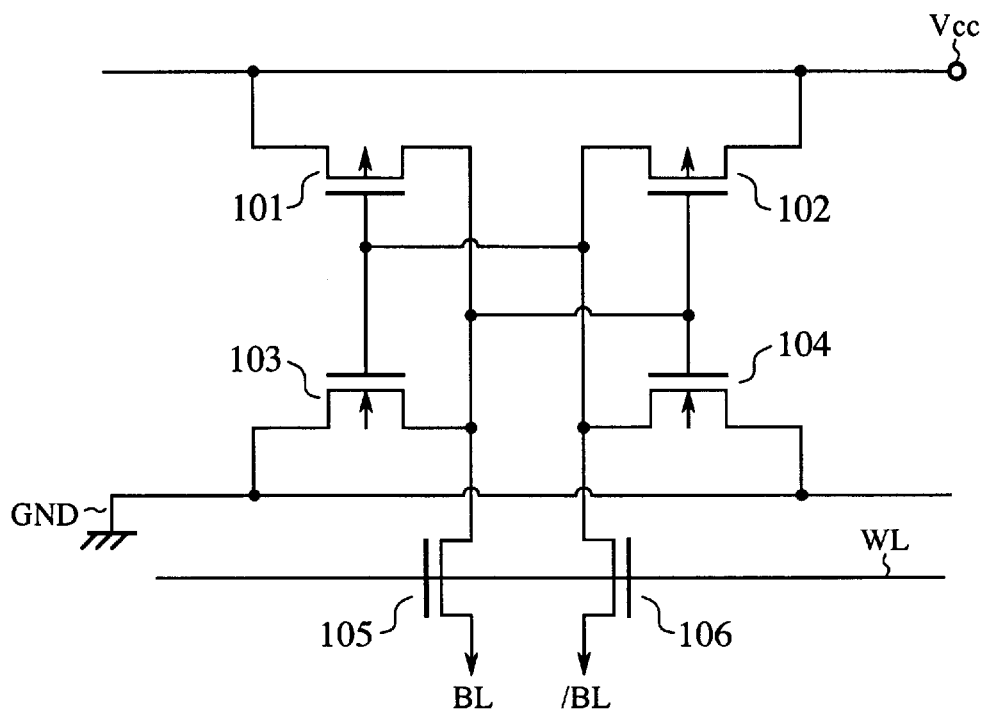
FIG. 9 is a circuit diagram showing the memory cell of a SRAM in a conventional semiconductor device.
Figure 10:
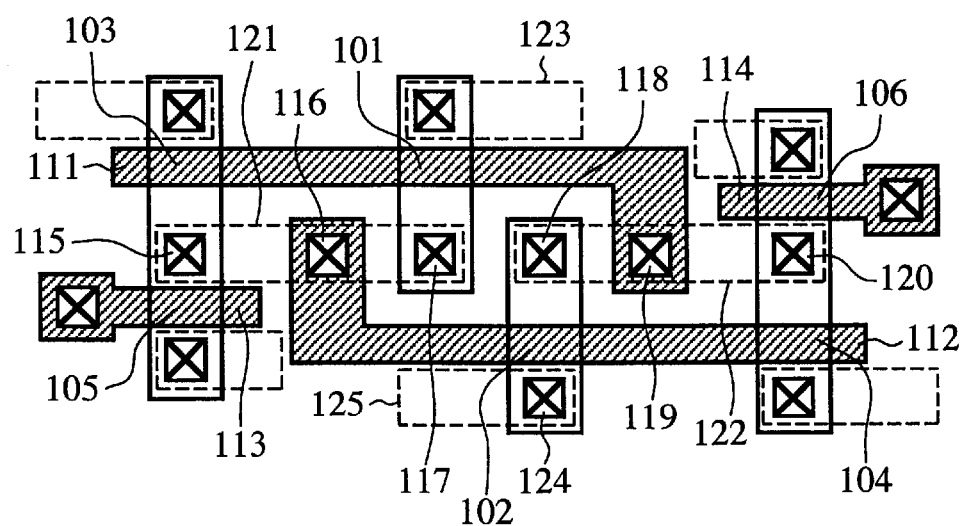
FIG. 10 is a layout diagram showing the memory cell of a SRAM in a conventional semiconductor device.
Figure 11:
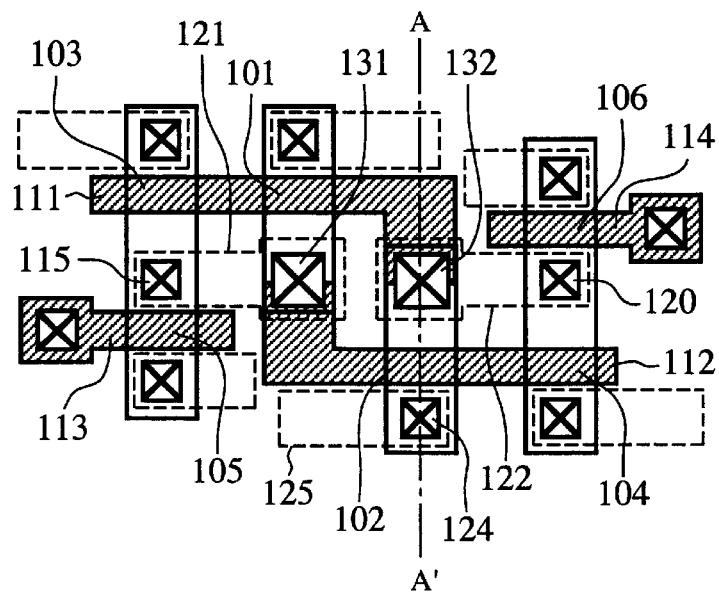
FIG. 11 is a layout diagram showing the memory cell of a SRAM in a conventional semiconductor device.
Figure 12:
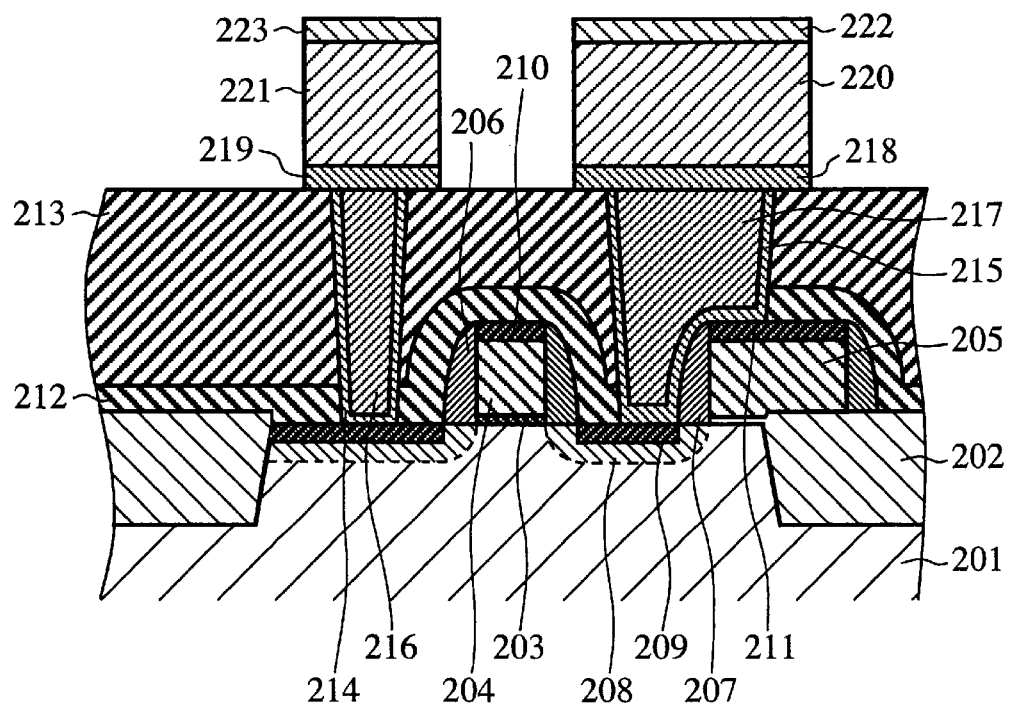
FIG. 12 is a sectional view showing the manufacturing process of a SRAM in a conventional semiconductor device.

FIG. 8 is a sectional view showing the semiconductor device manufacturing process according to Embodiment 4 of the present invention, and a sectional view showing the manufacturing process of a DRAM memory cell region and a logic SRAM region. Because in FIG. 8 the same or equivalent parts are designated by similar numerals to the ones in FIGS. 6 and 7, the explanation is omitted. Barrier metal 55 is formed over the sidewall of the lower contact of the on-the-active-region contact consisting of two contacts, upper and lower contacts in the logic SRAM region, and W plug (a first plug) 56 is buried in the lower contact of the on-the-active-region contact.

The manufacturing method will next be described.

Only the part of the manufacturing method of the semiconductor device in Embodiment 4 that is different from the ones in Embodiments 1–3 will be described. In Embodiment 4, the following process is performed in place of the process where doped polysilicon 43 is buried shown in FIG. 6. Barrier metal 55 is formed by use of deposition by means of sputtering or CVD, for instance, and processing. Subsequently, tungsten is deposited by means of CVD for instance, and planarized, to thereby bury W plug 56. Note that this process is performed simultaneously in a process where barrier metals 47, 51, and 53, and W plug 48, 52, and 54 are formed. The following manufacturing processes are the same as the ones in Embodiment 2.

As mentioned above, according to Embodiment 4, the same effect as the ones in Embodiments 1 and 2 is obtained, and simultaneously the following effect is obtained. That is, because W plugs 52 and 54 are formed in the lower contact of the bit line direct contact in the DRAM memory cell region and the storage node direct contact, W plug 56 can be formed in the lower contact of the on-the-active-region contact in the logic SRAM region. As a result, the contact resistance can be reduced.

What is claimed is:

1. A semiconductor device in which DRAMs and SRAMs are combined, said device comprising in the SRAM region:
   a first suicide layer formed on a surface of a diffused layer, a portion of said first suicide layer being adjacent to a gate electrode;
   a second suicide layer formed on a surface of said gate electrode;
   an insulating side wall formed over a sidewall of said gate electrode;
   a first contact hole opened in a first interlayer dielectric formed on top, and exposing said sidewall and said first and second silicide layers in the first contact hole;
   a first contact which constitutes a shared contact between said first and second silicide layers through a first plug within said first contact hole;
   a second contact hole opened in a second interlayer dielectric formed on top;
   a first wiring layer formed on the second interlayer dielectric;
   a second contact for connecting electrically said first contact to said first wiring layer through a second plug within said second contact hole;
   a third contact hole opened in said first and second interlayer dielectrics, and exposing said first silicide layer on the surface of said diffused layer in the third contact hole; and
   a third contact for connecting electrically said first silicide layer to said first wiring layer through said second plug within said third contact hole,
   said device further comprising in the DRAM region:
   an insulating side wall over the sidewall of a gate electrode;

a lower contact formed through the first plug within the first contact hole which is opened in the first interlayer dielectric formed on top, adjacent to said gate electrode, and exposes the surface of the diffused layer; and an upper contact formed through the second plug within the second contact hole opened in the second interlayer dielectric formed on top, and connecting electrically the lower contact to the first wiring layer.

2. The semiconductor device according to claim 1, wherein the third contact formed in the third contact hole has the first plug between the second plug and the first silicide on the surface of the diffused layer.

3. The semiconductor device according to claim 1, wherein the first contact is formed in the same process as the lower contact of the DRAM.

4. The semiconductor device according to claim 1, wherein the second and third contacts are formed in the same process as the upper contact of the DRAM.

5. The semiconductor device according to claim 1, wherein at least one of the first and second plugs is made of a metal containing tungsten.

6. The semiconductor device according to claim 2, wherein the second interlayer dielectric is constituted by stacking a second dielectric on a first dielectric, and the second contact hole is opened by selective etching between said first and second dielectrics.

7. The semiconductor device according to claim 6, wherein the first and second dielectrics are respectively constituted by silicon nitride and silicon oxide.

* * * * *